(12) United States Patent
Paek et al.

(10) Patent No.: US 8,446,017 B2
(45) Date of Patent: May 21, 2013

(54) STACKABLE WAFER LEVEL PACKAGE AND FABRICATING METHOD THEREOF

(75) Inventors: Jong Sik Paek, Seoul (KR); In Bae Park, Seoul (KR); Chang Deok Lee, Uijeongbu-si (KR)

(73) Assignee: Amkor Technology Korea, Inc., Seoul (KR)

( * ) Notice: Subject to any disclaimer, the term of this patent is extended or adjusted under 35 U.S.C. 154(b) by 258 days.

(21) Appl. No.: 12/562,387

(22) Filed: Sep. 18, 2009

(65) Prior Publication Data

US 2011/0068427 A1  Mar. 24, 2011

(51) Int. Cl.
  *H01L 23/48* (2006.01)
  *H01L 23/52* (2006.01)
  *H01L 29/40* (2006.01)
(52) U.S. Cl.
  USPC .......................................... 257/778; 257/777
(58) Field of Classification Search .................. 257/777, 257/778, 774
See application file for complete search history.

(56) References Cited

U.S. PATENT DOCUMENTS

| | | | | |
|---|---|---|---|---|
| 6,600,221 B2 * | 7/2003 | Kimura | | 257/686 |
| 6,765,299 B2 * | 7/2004 | Takahashi et al. | | 257/777 |
| 7,335,994 B2 * | 2/2008 | Klein et al. | | 257/778 |
| 2006/0040463 A1 * | 2/2006 | Sunohara | | 438/424 |
| 2007/0013048 A1 * | 1/2007 | Sunohara et al. | | 257/698 |

* cited by examiner

*Primary Examiner* — Jenny L Wagner
(74) *Attorney, Agent, or Firm* — Workman Nydegger (57) ABSTRACT

A stackable wafer level package and a fabricating method thereof are disclosed. In the stackable wafer level package, bond pads (or redistribution layers) are arranged on a bottom semiconductor die, and metal pillars are formed on some of the bond pads positioned around the edges of the bottom semiconductor die. A top semiconductor die is electrically connected to the other bond pads, on which the metal pillars are not formed, positioned around the center of the bottom semiconductor die through conductive bumps. The metal pillars and the top semiconductor die are encapsulated by an encapsulant. A plurality of interconnection patterns electrically connected to the metal pillars are formed on the surface of the encapsulant. Solder balls are attached to the interconnection patterns. Due to this stack structure, the wafer level package is reduced in thickness and footprint. Therefore, the wafer level package is highly suitable for mobile applications.

13 Claims, 9 Drawing Sheets

FIG.11G

STACKABLE WAFER LEVEL PACKAGE AND FABRICATING METHOD THEREOF

BACKGROUND OF THE INVENTION

1. Field of the Invention

An embodiment of the present invention is related to a stackable wafer level package and a fabricating method thereof.

2. Description of the Related Art

An increasing demand for small-sized, lightweight and high-performance electronic devices has motivated the development of small-sized, lightweight and high-performance electronic components. This motivation has led to the development of semiconductor design and manufacturing technologies and significant advances in various packaging technologies. Representative examples of such advanced packages are ball grid array (BGA) packages, flip-chip packages and chip size packages (CSPs), which are based on area array and surface mount packaging technologies. Chip size packages (CSPs) have received considerable attention due to the possibility that the size may be reduced to that of actual chips. Particularly, wafer level chip size packages (WLCSPs), which are fabricated at a wafer level, have the advantage of greatly reduced packaging cost because of an increase in the number of semiconductor chips produced from one wafer. Therefore, when WLCSP technologies are applied to the production of wafers, e.g., 300 mm wafers featuring high chip production yield per wafer, the fabrication cost of packages can be greatly reduced. In recent years, there has been an increasing interest in the development of WLCSP technologies in view of packaging cost.

BRIEF SUMMARY OF THE INVENTION

An embodiment of the present invention provides a wafer level package including a first semiconductor die having metal pillars, a second semiconductor die connected to the first semiconductor die, an encapsulant covering the first semiconductor die and the second semiconductor die, a plurality of redistribution layers formed over the second semiconductor die and the encapsulant and electrically connected to the metal pillars, and a plurality of solder balls connected to the redistribution layers.

The first semiconductor die is electrically interconnected to the second semiconductor die through conductive bumps.

The first semiconductor die is adhered to the second semiconductor die by means of an adhesive.

The second semiconductor die has through-silicon vias (TSVs) electrically connected to the redistribution layers.

The wafer level package further includes a third semiconductor die connected to the second semiconductor die.

The wafer level package further includes auxiliary metal pillars formed between the second semiconductor die and the redistribution layers and connected to the redistribution layers.

The first semiconductor die has a width larger than that of the second semiconductor die.

The metal pillars are made of a material selected from gold (Au), nickel (Ni), copper (Cu), eutectic solders, lead-free solders, nickel-gold (Ni—Au) alloys, copper-nickel (Cu—Ni) alloys, and copper (Cu) lead-free solders.

The wafer level package further includes a third semiconductor die connected to the first semiconductor die, the third semiconductor die has through-silicon vias (TSVs) electrically connected the redistribution layers.

The first semiconductor die has a recess, the second semiconductor die is adhered to the recess.

The plurality of redistribution layers are electrically connected to the first semiconductor die via the metal pillars, the plurality of redistribution layers are fan out type from the second semiconductor die.

Another embodiment of the present invention provides a wafer level package comprising a substrate having interconnection patterns and metal pillars formed on the interconnection patterns, a first semiconductor die connected to the interconnection patterns of the substrate, at least one second semiconductor die connected to the first semiconductor die, an encapsulant covering the first semiconductor die and the second semiconductor die, redistribution layers formed on the encapsulant and electrically connected to the metal pillars, and solder balls connected to the redistribution layers.

The substrate is made of a material through which light passes.

The first semiconductor die is an image sensor.

The second semiconductor die is an image processor or a memory.

The first semiconductor die is electrically interconnected to the interconnection patterns through conductive bumps.

The first semiconductor die has an image sensing area and dams are formed around the circumference of the image sensing area.

The wafer level package further includes auxiliary metal pillars formed between the second semiconductor die and the redistribution layers.

The wafer level package further includes through-silicon vias (TSVs) electrically connecting the first semiconductor die and the second semiconductor die.

Another embodiment of the present invention provides a method for fabricating a wafer level package, comprising: preparing a first semiconductor die having metal pillars; connecting a second semiconductor die to the first semiconductor die; encapsulating the metal pillars and the second semiconductor die by an encapsulant; grinding the encapsulant, the second semiconductor die and the metal pillars; forming redistribution layers over the encapsulant, the second semiconductor die and the metal pillars; and attaching solder balls to the redistribution layers.

The encapsulant completely surrounds the metal pillars of the first semiconductor die and the second semiconductor die.

The grinding is performed until the metal pillars and the second semiconductor die are exposed to the outside through the encapsulant.

An embodiment of the present invention will be more apparent from the following detailed description taken in conjunction with the accompanying drawings.

DETAILED DESCRIPTION OF THE INVENTION

Figure 1:
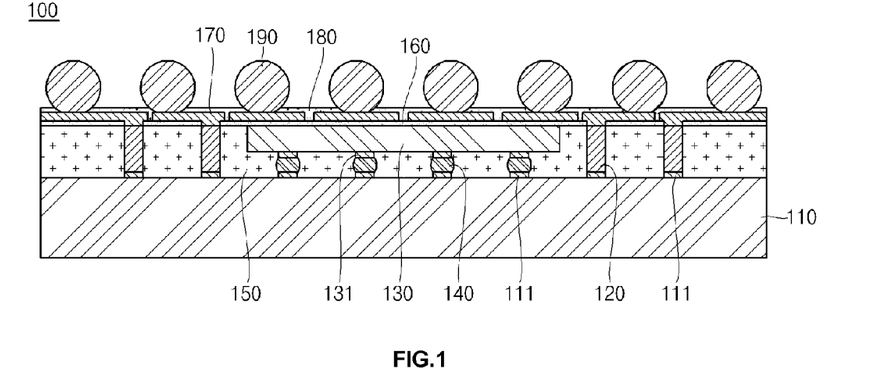
FIG. 1 is a partial cross-sectional view illustrating a stackable wafer level package according to an embodiment of the present invention.

Referring to FIG. 1, a cross-sectional view of a stackable wafer level package 100 according to an embodiment of the present invention is illustrated.

As illustrated in FIG. 1, the wafer level package 100 includes a first semiconductor die 110, metal pillars 120, a second semiconductor die 130, conductive bumps 140, an encapsulant 150, a first passivation layer 170, redistribution layers 170, a second passivation layer 180 and solder balls 190.

There is no restriction on the kind of materials for the first semiconductor die 110. For example, the first semiconductor die 110 may be selected from silicon semiconductors, GaAs semiconductors and equivalents thereof that are commonly known in the art. The first semiconductor die 110 may have a plurality of bond pads or redistribution layers (hereinafter, collectively referred to as "bond pads 111") formed on the upper surface thereof.

The metal pillars 120 may be formed on some of the bond pads 111 positioned around the circumference of the first semiconductor die 110. There is no restriction on the material of the metal pillars 120. For example, the metal pillars 120 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof. The upper surfaces of the metal pillars 120 lie in substantially the same plane as the upper surface of the second semiconductor die 130 and the upper surface of the encapsulant 150.

There is no restriction on the kind of materials for the second semiconductor die 130. For example, the second semiconductor die 130 may be selected from silicon semiconductors, GaAs semiconductors and equivalents thereof that are commonly known in the art. The second semiconductor die 130 may have a plurality of bond pads 131 formed on the lower surface thereof. The second semiconductor die 130 may have a width smaller than that of the first semiconductor die 110.

The conductive bumps 140 electrically interconnect the first semiconductor die 110 to the second semiconductor die 130. Specifically, the conductive bumps 140 electrically interconnect the bond pads 111 of the first semiconductor die 110 to the respective bond pads 131 of the second semiconductor die 130. There is no restriction on the material of the conductive bumps 140. For example, the conductive bumps 140 may be made of a material selected from eutectic solders, lead-free solders, and equivalents thereof. The conductive bumps 140 have a melting point lower than that of the metal pillars 120. Accordingly, even when the conductive bumps 140 are melted, the metal pillars 120 maintain their fine pitch without collapsing.

The encapsulant 150 encapsulates the metal pillars 120, the second semiconductor die 130 and the conductive bumps 140. The encapsulant 150 is substantially formed on the upper surface of the first semiconductor die 110 so that the lower and side surfaces of the first semiconductor die 110 can be exposed to the outside. Further, the upper surfaces of the metal pillars 120 and the upper surface of the second semiconductor die 130 may be substantially exposed to the outside through the encapsulant 150. The encapsulant 150 may be a molded underfill that can be sufficiently filled in a gap between the first semiconductor die 110 and the second semiconductor die 130. The molded underfill is a material that has a high glass transition temperature and a low coefficient of thermal expansion to improve the reliability of the semiconductor device.

The first passivation layer 160 may be formed on the upper surface of the second semiconductor die 130 and the encapsulant 150. Especially, the first passivation layer 160 on the second semiconductor die 130 prevents the redistribution layers 170 from a current leakage due to the upper surface of the second semiconductor die 130.

The first passivation layer 160 may be formed of a material selected from, but not limited to, polyimide (PI), benzocyclobutene (BCB), polybenzoxazole (PBO), bismaleimide-triazine (BT) resins, phenolic resins, epoxy resins, silicone resins, silicon dioxide, silicon nitride and equivalents thereof.

The redistribution layers 170 are formed over the upper surfaces of the metal pillars 120, the second semiconductor die 130 and the encapsulant 150. The redistribution layers 170 are electrically connected to the metal pillars 120 and extend with various shapes on the upper surface of the second semiconductor die 130 and/or the upper surface of the encapsulant 150. The redistribution layers 170 may be combinations of two or more metal layers. For example, the redistribution layers 170 may include a copper (Cu) layer as a solder adhesive layer and titanium (Ti), nickel (Ni) and palladium (Pd) layers as barrier layers. However, there is no restriction on the metal materials for the redistribution layers 170.

The second passivation layer 180 may be formed on the upper surfaces of the second semiconductor die 130 and the encapsulant 150 while surrounding the redistribution layers 170. The second passivation layer 180 has openings formed at positions thereof corresponding to the solder balls 190. The solder balls 190 are welded to the redistribution layers 170 through the openings.

The second passivation layer 180 may be formed of a material selected from, but not limited to, polyimide (PI), benzocyclobutene (BCB), polybenzoxazole (PBO), bismaleimide-triazine (BT) resins, phenolic resins, epoxy resins, silicone resins and equivalents thereof.

The solder balls 190 may be welded to the areas of the redistribution layers 170 exposed by the openings of the second passivation layer 180. The solder balls 190 play a substantial role in electrically connecting the semiconductor device to an external device therethrough. The solder balls 190 may be made of a material selected from, but not limited to, eutectic solders (e.g., Sn37Pb), high-lead solders (e.g., Sn95Pb) having a high melting point, lead-free solders (e.g., SnAg, SnCu, SnZn, SnAu, SnZnBi, SnAgCu and SnAgBi) and equivalents thereof.

According to this embodiment, the die stack structure of the wafer level package 100 makes the semiconductor device more functional. In addition, despite the high performance, the wafer level package 100 can be reduced in thickness and footprint, thus being suitable for mobile applications.

Figure 2:
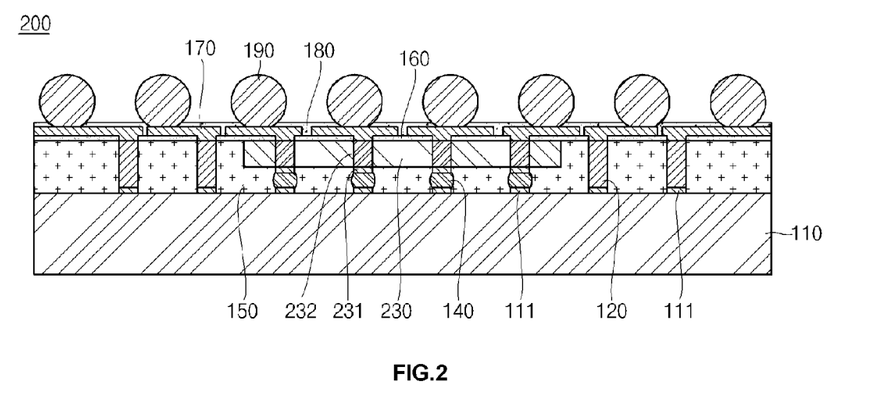
FIG. 2 is a partial cross-sectional view illustrating a stackable wafer level package according to another embodiment of the present invention.

Referring to FIG. 2, a partial cross-sectional view of a stackable wafer level package 200 according to another embodiment of the present invention is illustrated.

The wafer level package 200 is structurally similar to the wafer level package 100 illustrated in FIG. 1. Only the differences between the two wafer level packages 100 and 200 will be explained hereinafter.

As illustrated in FIG. 2, a second semiconductor die 230 of the wafer level package 200 may have bond pads 231 formed on the lower surface thereof and through-silicon vias (TSVs) 232 connected to the respective bond pads 231. The through-silicon vias 232 may be electrically connected to the redistribution layers 170. With this configuration, the second semiconductor die 230 can be directly electrically connected to the redistribution layers 170 as well as the first semiconductor die 110. The through-silicon vias 232 are formed by forming through-holes penetrating the second semiconductor die 130 and filling a conductive material in the through-holes.

The second semiconductor die 230, of course, may have the first passivation layer 160 on the upper surface thereof to prevent from a current leakage. That is, the second passivation layer 160 is formed between the second semiconductor die 230 and the redistribution layers 170.

According to this embodiment, the electrical connection distance between the second semiconductor die 230 and the redistribution layers 170 of the wafer level package 200 can be shortened, thus contributing to the improvement in the electrical performance of the semiconductor device.

Figure 3:
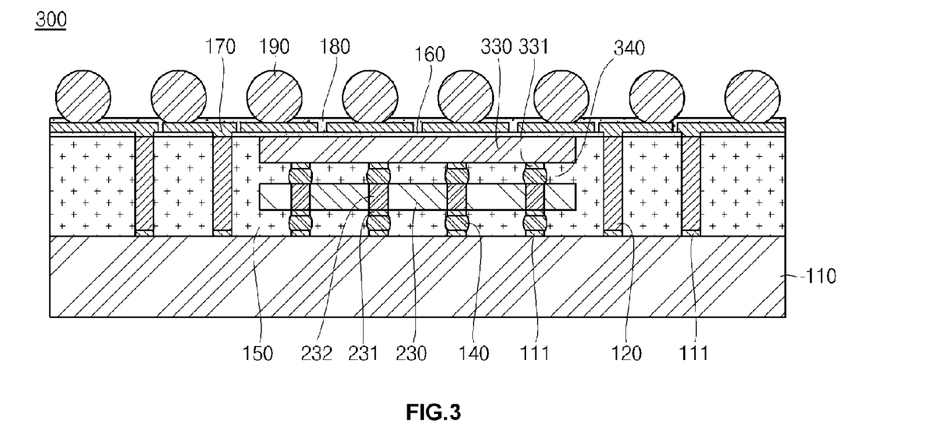
FIG. 3 is a partial cross-sectional view illustrating a stackable wafer level package according to another embodiment of the present invention.

Referring to FIG. 3, a partial cross-sectional view of a stackable wafer level package 300 according to another embodiment of the present invention is illustrated.

The wafer level package 300 is structurally similar to the wafer level package 200 illustrated in FIG. 2. Only the differences between the two wafer level packages 200 and 300 will be explained hereinafter.

As illustrated in FIG. 3, the wafer level package 300 may include a third semiconductor die 330 positioned on the second semiconductor die 230. The third semiconductor die 330 has a plurality of bond pads 331 formed on the lower surface thereof and electrically connected to the respective through-silicon vias 232 of the second semiconductor die 230. The encapsulant 150 is filled in a gap between the second semiconductor die 230 and the third semiconductor die 330. Some of the redistribution layers 170 are formed on the upper surface of the third semiconductor die 330.

The third semiconductor die 330, of course, may have the passivation layer 160 on the upper surface thereof to prevent from a current leakage. That is, the passivation layer is formed between the third semiconductor die 330 and the redistribution layers 170.

According to this embodiment, the third semiconductor die 330 of the wafer level package 300 makes the semiconductor device more functional without any increase in footprint.

Figure 4:
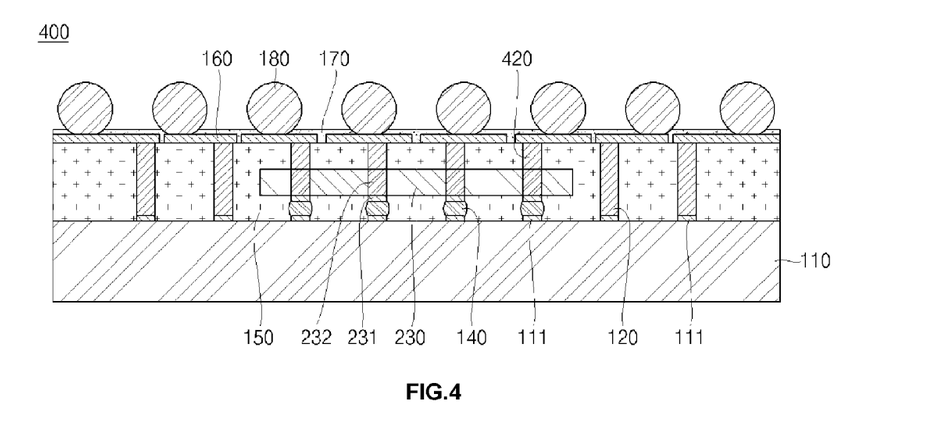
FIG. 4 is a partial cross-sectional view illustrating a stackable wafer level package according to another embodiment of the present invention.

Referring to FIG. 4, a partial cross-sectional view illustrating a stackable wafer level package 400 according to another embodiment of the present invention is illustrated.

The wafer level package 400 is structurally similar to the wafer level package 200 illustrated in FIG. 2. Only the differences between the two wafer level packages 200 and 400 will be explained hereinafter.

As illustrated in FIG. 4, a plurality of auxiliary metal pillars 420 are formed on the second semiconductor die 230 and are electrically connected to the redistribution layers 170. The encapsulant 150 is also filled between the second semiconductor die 230 and the redistribution layers 170 to surround the auxiliary metal pillars 420.

There is no restriction on the material of the auxiliary metal pillars 420. For example, the auxiliary metal pillars 420 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof.

According to this embodiment, the electrical connection distance between the second semiconductor die 230 and the redistribution layers 170 of the wafer level package 400 can be shortened, thus contributing to the improvement in the electrical performance of the semiconductor device.

Figure 5:
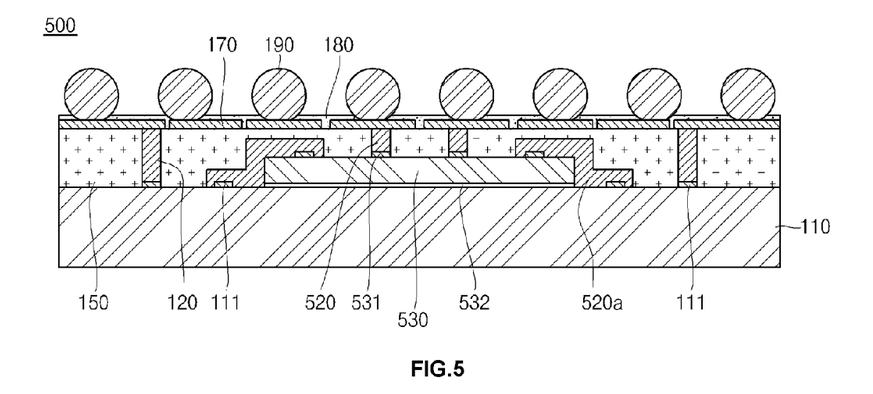
FIG. 5 is a partial cross-sectional view illustrating a stackable wafer level package according to another embodiment of the present invention.

Referring to FIG. 5, a partial cross-sectional view illustrating a stackable wafer level package 500 according to another embodiment of the present invention is illustrated.

The wafer level package 500 is structurally similar to the wafer level package 400 illustrated in FIG. 4. Only the differences between the two wafer level packages 400 and 500 will be explained hereinafter.

As illustrated in FIG. 5, a second semiconductor die 530 may be adhered to the first semiconductor die 110 by means of a die attach material 532. There is no restriction on the kind of materials for the die attach material 532. For example, the die attach material 532 may be selected from adhesives, adhesive films, epoxy resins and equivalents thereof.

A plurality of bond pads 531 are formed on the upper surface of the second semiconductor die 530, and auxiliary metal pillars 520 are formed thereon. The auxiliary metal pillars 520 are electrically connected to the redistribution layers 170.

A plurality of electrically conductive patterns 520a are formed on the first semiconductor die 110 and the second semiconductor die 530. That is, the plurality of electrically conductive patterns 520a electrically connect the bond pads 111 of the first semiconductor die 110 to the bond pads 531 of the second semiconductor die 530. Furthermore, the plurality of electrically conductive patterns 520a are formed on the side surface of the second semiconductor die 530 as well as the upper surface of the first and second semiconductor die 110 and 530.

According to this embodiment, the die stack structure of the wafer level package 500 makes the semiconductor device more functional. In addition, the electrical connection distance between the second semiconductor die 530 and the redistribution layers 170 of the wafer level package 500 can be shortened, thus contributing to the improvement in the electrical performance of the semiconductor device. Furthermore, despite the high performance, the wafer level package 500 is reduced in thickness and footprint, thus being suitable for mobile applications.

Figure 6:
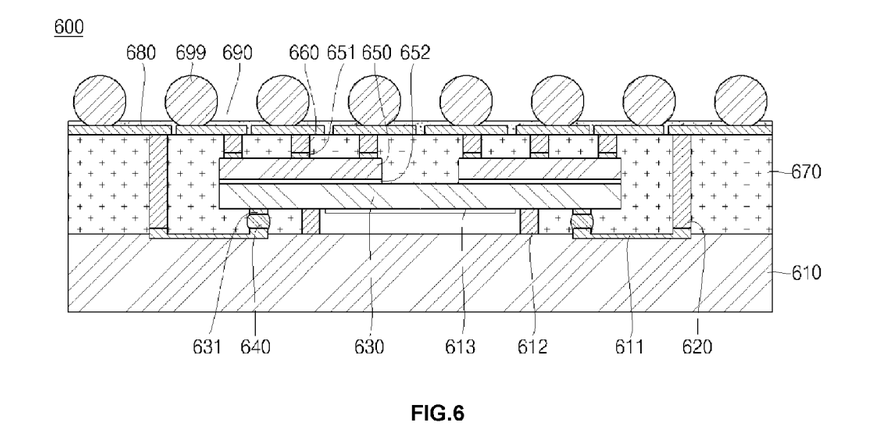
FIG. 6 is a partial cross-sectional view illustrating a stackable wafer level package according to another embodiment of the present invention.

Referring to FIG. 6, a partial cross-sectional view illustrating a stackable wafer level package 600 according to another embodiment of the present invention is illustrated.

As illustrated in FIG. 6, the wafer level package 600 includes a substrate 610, metal pillars 620, a first semiconductor die 630, conductive bumps 640, second semiconductor dies 650, auxiliary metal pillars 660, an encapsulant 670, redistribution layers 680, a passivation layer 690, and solder balls 699.

The substrate 610 is substantially in the form of a flat plate. The substrate 610 may be made of a material through which light can pass. For example, the substrate 610 may be made of a material selected from glass and its equivalents. The substrate 610 may have a plurality of interconnection patterns 611. The interconnection patterns 611 electrically interconnect the first semiconductor die 630 to the metal pillars 620.

The metal pillars 620 are formed on the substrate 610. Specifically, the metal pillars 620 are electrically connected to the respective interconnection patterns 611 and extend upwardly from the substrate 610. There is no restriction on the material of the metal pillars 620. For example, the metal pillars 620 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof. The upper surfaces of the metal pillars 620 lie in the same plane as the upper surface of the encapsulant 670.

The first semiconductor die 630 may be an image sensor. In this case, the first semiconductor die 630 has an image sensing area 613 that is not covered by the encapsulant 670 to sense external images. The first semiconductor die 630 has bond pads 631 formed on the lower surface thereof. Dams 612 are formed between the bond pads 631 and the image sensing area 613 to prevent the image sensing area 613 from being covered by the encapsulant 670. The dams 612 may be made of any suitable material, such as a resin or a metal.

The conductive bumps 640 play a role in interconnecting the interconnection patterns 611 to the bond pads 631. There is no restriction on the material of the conductive bumps 640. For example, the conductive bumps 640 may be made of a material selected from eutectic solders, lead-free solders, and equivalents thereof.

The second semiconductor dies 650 are disposed on and connected to the first semiconductor die 630. Specifically, the second semiconductor dies 650 are adhered on the first semiconductor die 630 by means of a die attach material 652. The second semiconductor dies 650 may be image processors or memories, but the present invention is not limited thereto. The second semiconductor dies 650 may have a plurality of bond pads 651 formed on the upper surface thereof.

The auxiliary metal pillars 660 are formed on the bond pads 651 of the second semiconductor dies 650. The upper surfaces of the auxiliary metal pillars 660 lie in the same plane as the upper surfaces of the metal pillars 620 and the upper surface of the encapsulant 670. There is no restriction on the material of the metal pillars 660. For example, the auxiliary metal pillars 660 may be made of a material selected from gold (Au), nickel (Ni), copper (Cu), eutectic solders, lead-free solders, nickel-gold (Ni—Au) alloys, copper-nickel (Cu—Ni) alloys, copper (Cu) lead-free solders, and equivalents thereof.

The encapsulant 670 surrounds the metal pillars 620, the first semiconductor die 630, the conductive bumps 640, the second semiconductor dies 650 and the auxiliary metal pillars 660 on the substrate 610. The dams 612 are formed between the substrate 610 and the first semiconductor die 630 to prevent the encapsulant 670 from flowing onto the image sensing area 613 of the first semiconductor die 630. The upper surfaces of the metal pillars 620, the auxiliary metal pillars 660 and the encapsulant 670 are coplanar.

The redistribution layers 680 are formed on the upper surface of the encapsulant 670. Each of the redistribution layers 680 is electrically connected to the metal pillar 620 or the auxiliary metal pillar 660. The redistribution layers 680 extend with various shapes on the upper surface of the encapsulant 670. The redistribution layers 680 may include a copper (Cu) layer as a solder adhesive layer and titanium (Ti), nickel (Ni) and palladium (Pd) layers as barrier layers. However, there is no restriction on the metal materials for the redistribution layers 680.

The passivation layer 690 may be formed on the upper surfaces of the encapsulant 670 while surrounding the redistribution layers 680. The passivation layer 690 has openings formed at positions thereof corresponding to the solder balls 699. The solder balls 699 are welded to the redistribution layers 680 through the openings. The passivation layer 690 may be formed of a material selected from, but not limited to, polyimide (PI), benzocyclobutene (BCB), polybenzoxazole (PBO), bismaleimide-triazine (BT) resins, phenolic resins, epoxy resins, silicone resins and equivalents thereof.

The solder balls 699 are welded to the areas of the redistribution layers 680 exposed by the openings of the passivation layer 690. The solder balls 699 play a substantial role in electrically connecting the semiconductor device to an external device therethrough. The solder balls 699 may be made of a material selected from, but not limited to, eutectic solders (e.g., Sn37Pb), high-lead solders (e.g., Sn95Pb) having a high melting point, lead-free solders (e.g., SnAg, SnCu, SnZn, SnAu, SnZnBi, SnAgCu and SnAgBi) and equivalents thereof.

According to this embodiment, the die stack structure of the wafer level package 600 makes the semiconductor device more functional. In addition, despite the high performance, the wafer level package 600 is reduced in thickness and footprint, thus being suitable for mobile applications. Furthermore, the first semiconductor die 630 can convert external images into electrical signals and the second semiconductor dies 650 can process and store the electrical signals. That is, the use of the wafer level package 600 enables the manufacture of an image processing module using one semiconductor device.

Figure 7:
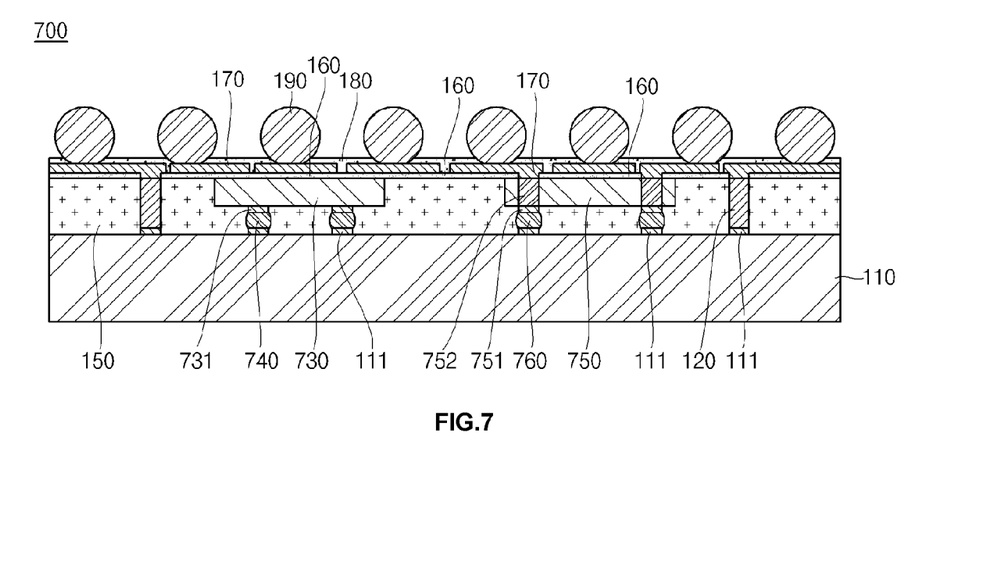
FIG. 7 is a partial cross-sectional view illustrating a stackable wafer level package according to another embodiment of the present invention.

Referring to FIG. 7, a partial cross-sectional view illustrating a stackable wafer level package 700 according to another embodiment of the present invention is illustrated.

As illustrated in FIG. 7, a stackable wafer level package 700 includes a second semiconductor die 730 and a third semiconductor die 750 on the first semiconductor die 110.

The second semiconductor die 730 may have a plurality of bond pads 731 formed on the lower surface thereof. Conductive bumps 740 electrically interconnect the first semiconductor die 110 to the second semiconductor die 730. Specifically, the conductive bumps 740 electrically interconnect the bond pads 111 of the first semiconductor die 110 to the respective bond pads 731 of the second semiconductor die 730.

The third semiconductor die 750 may have bond pads 751 formed on the lower surface thereof and through-silicon vias (TSVs) 752 connected to the respective bond pads 751. The through-silicon vias 752 may be electrically connected to the redistribution layers 170. With this configuration, the third semiconductor die 750 can be directly electrically connected to the redistribution layers 170 as well as the first semiconductor die 110. The through-silicon vias 752 are formed by forming through-holes penetrating the third semiconductor die 750 and filling a conductive material in the through-holes.

The second and third semiconductor die 740 and 750, of course, may have the passivation layer 160 on the upper surface thereof to prevent from a current leakage. That is, the passivation layer 160 is formed between the second semiconductor die 730 and the redistribution layers 170, and between the third semiconductor die 750 and the redistribution layers 170.

According to this embodiment, the second and third semiconductor die may be formed on the first semiconductor die, thus contributing to the improvement in the electrical performance of the semiconductor device.

Figure 8:
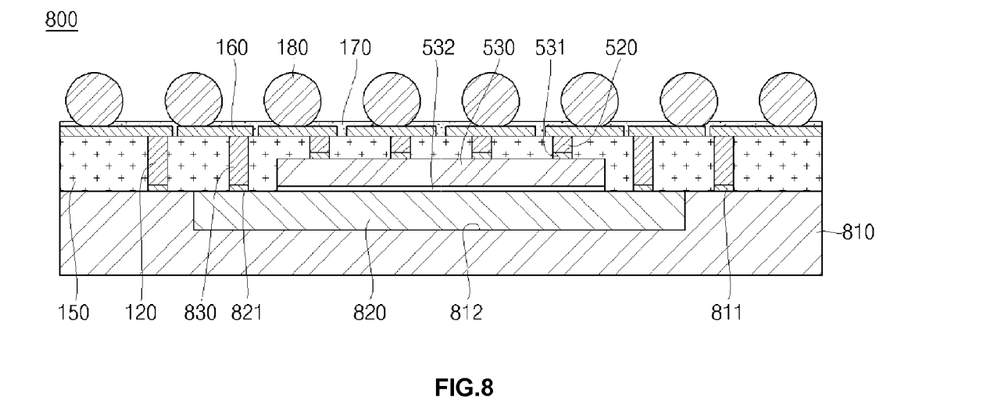
FIG. 8 is a partial cross-sectional view illustrating a stackable wafer level package according to another embodiment of the present invention.

Referring to FIG. 8, a partial cross-sectional view illustrating a stackable wafer level package 800 according to another embodiment of the present invention is illustrated.

As illustrated in FIG. 8, a stackable wafer level package 800 includes a first semiconductor die 810 and a second semiconductor die 820.

The first semiconductor die 810 may have a recess 812 having a predetermined depth on the upper surface thereof. In addition, the first semiconductor die 810 may have a plurality of bond pads 811 formed on the upper surface thereof and which is outside of the recess 812.

The second semiconductor die 820 may be adhered to the recess 812 of the first semiconductor die 810 by means of a die attach material (not shown). The upper surface of the first and second semiconductor dies 810 and 820 may be flush with each other horizontally. A plurality of bond pads 821 are formed on the upper surface of the second semiconductor die 820, and metal pillars 830 are formed thereon. The metal pillars 830 are electrically connected to the redistribution layers 170. That is, the redistribution layers 170 connected to the metal pillars 830 are fan out type from the second semiconductor die 820.

The third semiconductor die 530 may be adhered to the second semiconductor die 820 by means of a die attach material 532. A plurality of bond pads 531 are formed on the upper surface of the second semiconductor die 530, and auxiliary metal pillars 520 are formed thereon. The auxiliary metal pillars 520 are electrically connected to the redistribution layers 170.

According to this embodiment, the second and third semiconductor die may be formed on the first semiconductor die, thus contributing to the improvement in the electrical performance of the semiconductor device and reducing the size of the semiconductor device.

Figure 9:
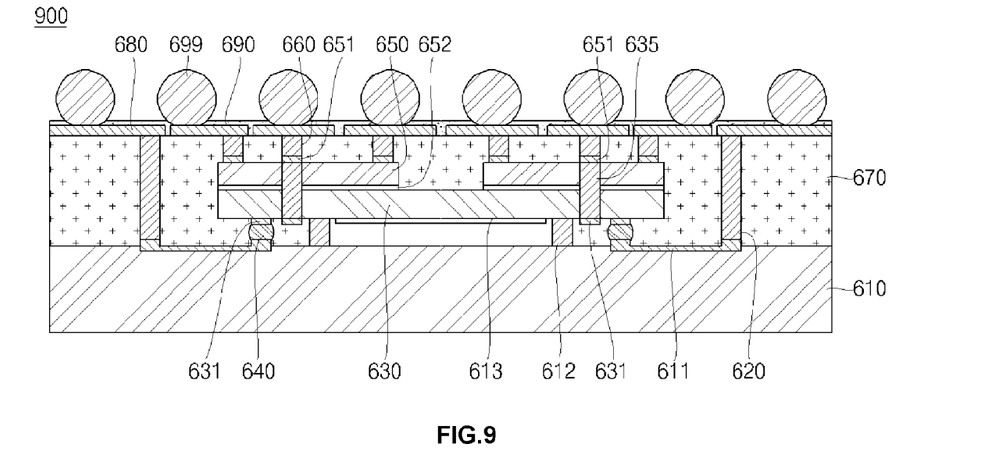
FIG. 9 is a partial cross-sectional view illustrating a stackable wafer level package according to another embodiment of the present invention.

Referring to FIG. 9, a partial cross-sectional view illustrating a stackable wafer level package 900 according to another embodiment of the present invention is illustrated.

As illustrated in FIG. 9, a stackable wafer level package 900 includes through-silicon vias 635 electrically connecting the first and second semiconductor dies 630 and 650. That is, the through-silicon vias 635 may be electrically and directly connect the bond pads 631 of the first semiconductor die 630 to the bond pads 651 of the second semiconductor die 650. In addition, the through-silicon vias 635 may be electrically connected to the redistribution layers 680. With this configuration, the second semiconductor die 650 can be electrically connected to the redistribution layers 680 as well as the first semiconductor die 630. The through-silicon vias 635 are formed by forming through-holes penetrating the first and second semiconductor die 630 and 650 and filling a conductive material in the through-holes.

According to this embodiment, the first semiconductor die 630 can convert external images into electrical signals and the second semiconductor dies 650 can process and store the electrical signals. That is, the use of the wafer level package 900 enables the manufacture of an image processing module using one semiconductor device.

Figure 10:
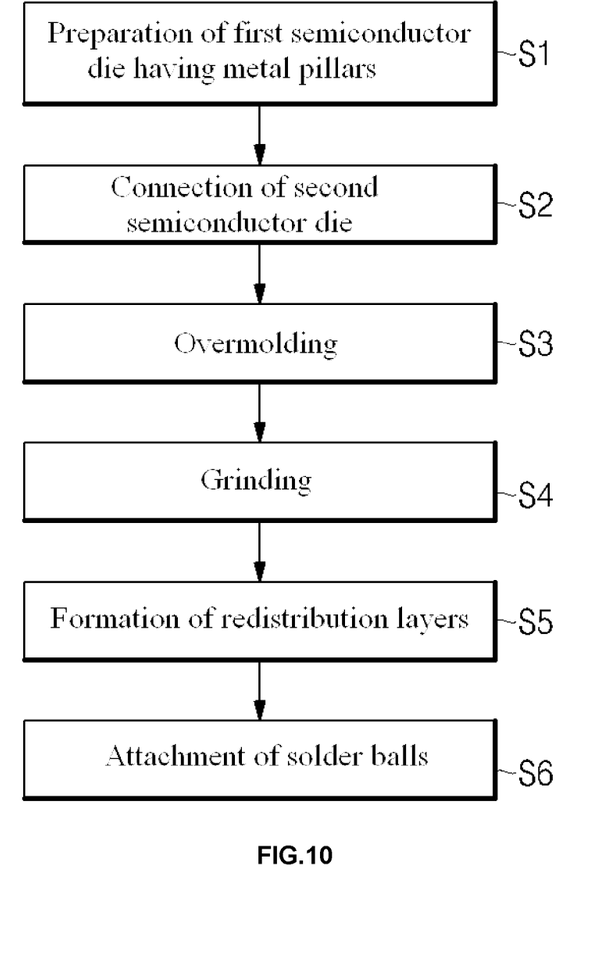
FIG. 10 is a flow chart illustrating a method for fabricating a stackable wafer level package according to an embodiment of the present invention.

Referring to FIG. 10, a flow chart of a method for fabricating a stackable wafer level package according to an embodiment of the present invention is illustrated.

As illustrated in FIG. 10, the method includes the following steps: preparation of a first semiconductor die (S1); connection of a second semiconductor die (S2); overmolding (S3); grinding (S4); formation of redistribution layers (S5); and attachment of solder balls (S6).

Referring to FIGS. 11A through 11G, cross-sectional views for explaining the steps of the method of FIG. 10 are illustrated sequentially.

Figure 11A:
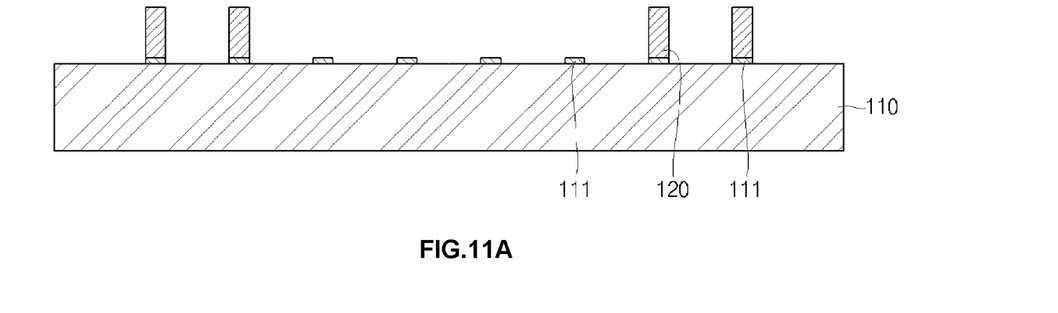
FIGS. 11A through 11G are cross-sectional views sequentially illustrating the steps of the method of FIG. 10.

As illustrated in FIG. 11A, in step S1, a plurality of bond pads 111 are formed on a first semiconductor die 110 and metal pillars 120 are formed on selected ones of the bond pads 111. Specifically, the metal pillars 120 are formed on some of the bond pads 111 positioned around the edges of the first semiconductor die 110 by metal plating. The metal pillars 120 are formed to a thickness sufficient to allow the upper surfaces thereof to lie in the same plane as the upper surface of an encapsulant 150 after the subsequent grinding step.

Figure 11B:
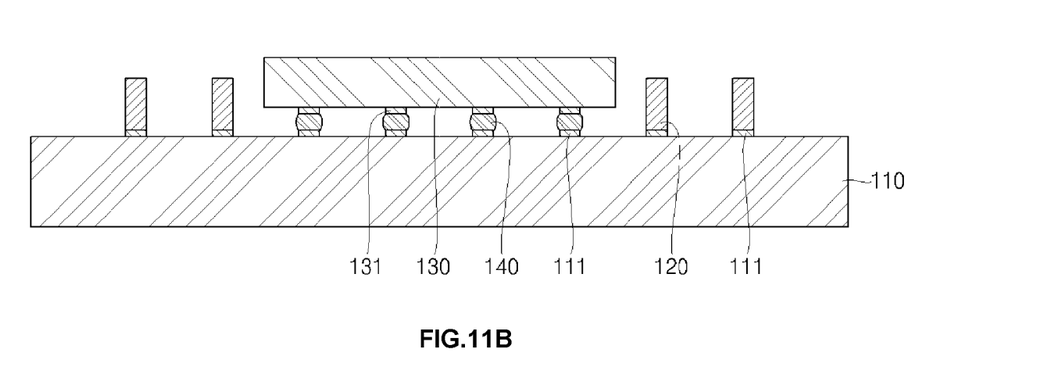

As illustrated in FIG. 11B, in step S2, a second semiconductor die 130 is electrically connected to the first semiconductor die 110, for example, in such a manner that conductive bumps 140 are formed on bond pads 131 of the second semiconductor die 130 and aligned on the bond pads 111 of the first semiconductor die 110, followed by reflow and cooling. The reflow and cooling can be performed by processes known in the art. As a result, the bond pads 111 of the first semiconductor die 110 are electrically interconnected to the respective bond pads 131 of the second semiconductor die 130. The second semiconductor die 130 may be a ground or not ground one. The present invention is not limited to the shape of the second semiconductor die 130.

Figure 11C:
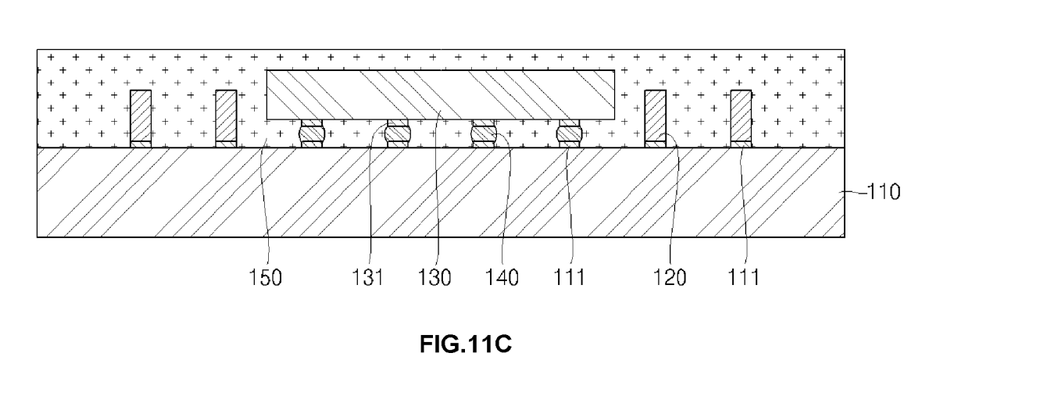

As illustrated in FIG. 11C, in step S3, the metal pillars 120 formed on the first semiconductor die 110, the second semiconductor die 130 and the conductive bumps 140 are completely encapsulated by an encapsulant 150. This overmolding can be performed by already known processes. Examples of such overmolding processes include transfer molding using a mold and dispensing using a dispenser, but the present invention is not limited thereto.

Figure 11D:
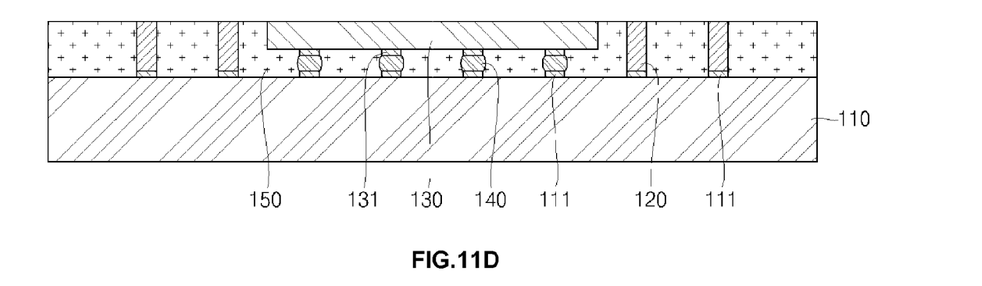
Figure 11E:
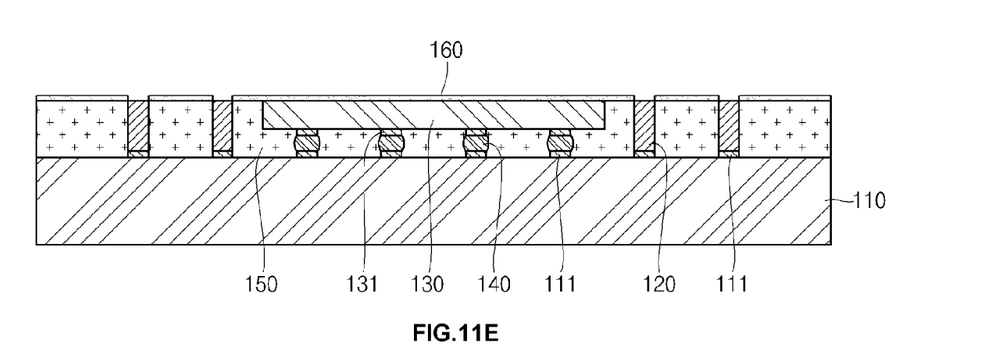

As illustrated in FIG. 11D, in step S4, the upper surfaces of the metal pillars 120, the second semiconductor die 130 and the encapsulant 150 are ground using a grinding tool to remove portions thereof. This grinding is performed until the second semiconductor die 130 becomes sufficiently thin. As a result of the grinding, the upper surfaces of the metal pillars 120, the second semiconductor die 130 and the encapsulant 150 are coplanar. As illustrated in FIG. 11E, a first passivation layer 160 may be formed on the upper surface of the second semiconductor die 130 and the encapsulant 150. The first passivation layer 160 on the second semiconductor die 130 prevents the redistribution layers 170 from a current leakage due to the upper surface of the second semiconductor die 130. The first passivation layer 160 may be formed of a material selected from, but not limited to, polyimide (PI), benzocyclobutene (BCB), polybenzoxazole (PBO), bismaleimide-triazine (BT) resins, phenolic resins, epoxy resins, silicone resins, silicon dioxide, silicon nitride and equivalents thereof.

Figure 11F:
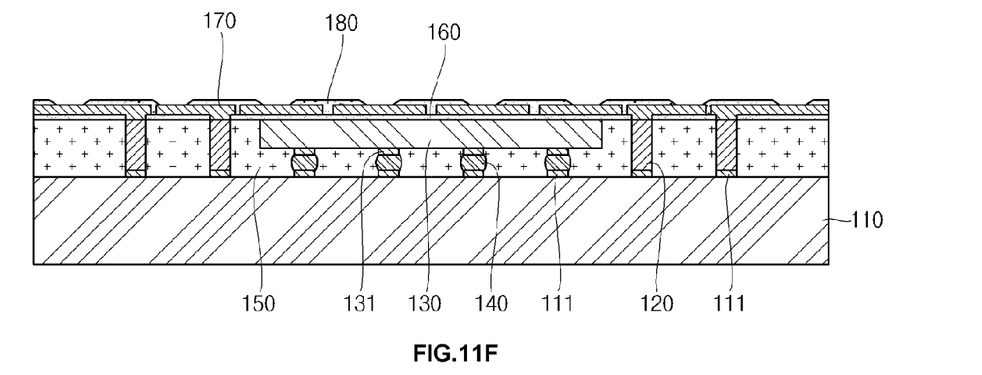

As illustrated in FIG. 11F, in step S5, redistribution layers 170 are formed over the upper surfaces of the first passivation layer 160 and the metal pillars 120. The redistribution layers 170 may have various shapes and lengths. Most of the redistribution layers 170 are electrically connected to the metal pillars 120. The redistribution layers 170 can be formed by photo and plating processes known in the art, but the present invention is not limited to these processes. Thereafter, a passivation layer 180 is formed so as to cover areas of the redistribution layers 170 other than areas to which solder balls 190 are to be attached in the subsequent step. The second passivation layer 180 can be formed by photo and coating processes known in the art, but the present invention is not limited to these processes.

Figure 11G:
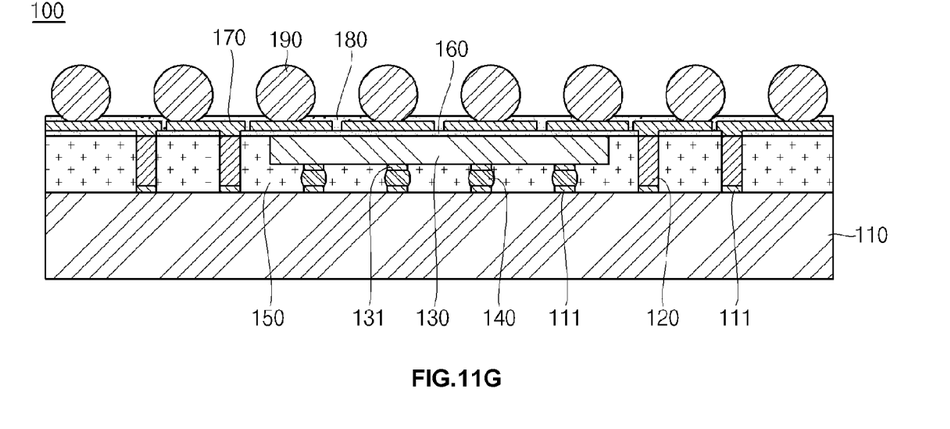

As illustrated in FIG. 11G, in step S6, solder balls 190 are attached to the areas of the redistribution layers 170 exposed through the passivation layer 180. The solder balls 190 can be attached by processes known in the art, such as flux dotting, solder ball dropping, solder ball reflowing and cooling, but the present invention is not limited to these processes.

The method may further include grinding the lower surface of the first semiconductor die 110 after step S6. All steps of the method are carried out at a wafer level. Therefore, after completion of the steps, sawing may be further performed to separate the wafer into individual packages. As a result of this sawing, the lower surface and side surfaces of the smaller first semiconductor dies 110 are exposed to the outside.

According to the method, the stacking of the semiconductor dies ensures high performance and small footprint of the wafer level package 100. In addition, the grinding of the stacked semiconductor dies makes the wafer level package 100 thinner. Furthermore, the first semiconductor die 110 is interconnected to the second semiconductor die 130 through the conductive bumps 140 and the first semiconductor die 110 is electrically connected to the redistribution layers 170 through the metal pillars 120 to shorten the electrical signal paths of the wafer level package 100. Therefore, the wafer level package 100 has improved electrical performance.

According to a prior art method, after encapsulation, metal pillars are formed by using laser to remove the encapsulant. In contrast, according to the method of the present invention, the metal pillars are formed by photo and plating processes, followed by encapsulation to form finer patterns. Therefore, the method of the present invention enables the formation of more input/output (IO) pins in a smaller area than the prior art method.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A wafer level package comprising
a first semiconductor die having metal pillars,
a second semiconductor die connected to the first semiconductor die,
an encapsulant covering the first semiconductor die and the second semiconductor die,
a plurality of redistribution layers that extend over both an upper surface of the second semiconductor die and an upper surface of the encapsulant and are electrically connected to the metal pillars, and
a plurality of solder balls connected to the redistribution layers,
wherein the first semiconductor die has a plurality of bond pads and one or more of the metal pillars is directly formed on a respective one of the bond pads, and the encapsulant directly encapsulates one of the one or more metal pillars,
wherein upper surfaces of the metal pillars, the second semiconductor die and the encapsulant are coplanar, and
wherein a passivation layer is formed on an upper surface of the second semiconductor die and an upper surface of the encapsulant, and the passivation layer is positioned beneath the redistribution layers.

2. The wafer level package of claim 1, wherein the first semiconductor die is electrically interconnected to the second semiconductor die through conductive bumps.

3. The wafer level package of claim 1, wherein the second semiconductor die has through-silicon vias (TSVs) electrically connected to the redistribution layers.

4. The wafer level package of claim 1, wherein the first semiconductor die has a width larger than that of the second semiconductor die.

5. The wafer level package of claim 1, wherein the metal pillars are made of a material selected from gold (Au), nickel (Ni), copper (Cu), eutectic solders, lead-free solders, nickel-gold (Ni—Au) alloys, copper-nickel (Cu—Ni) alloys, and copper (Cu) lead-free solders.

6. The wafer level package of claim 1, further wherein the passivation layer surrounds the redistribution layers, and the passivation layer includes openings through which the solder balls extend into contact with the redistribution layers.

7. The wafer level package of claim 1, wherein the passivation layer comprises a first passivation layer and a second passivation layer, the first passivation layer being formed on the upper surface of the second semiconductor die and the upper surface of the encapsulant, the second passivation layer being formed on the first passivation layer and surrounding the redistribution layers, and the second passivation layer including openings through which the solder balls extend into contact with the redistribution layers.

8. The wafer level package of claim 7, wherein the second passivation layer includes one of polyimide, benzocyclobutene, polybenzoxazole, bismaleimide-triazine resin, phenolic resin, epoxy resin, and silicone resin.

9. The wafer level package of claim 1, wherein the metal pillars are disposed about a circumference of the first semiconductor die.

10. The wafer level package of claim 1, wherein the metal pillars comprise one of gold, nickel, copper, eutectic solders, lead-free solders, nickel-gold alloys, copper-nickel alloys, and copper lead-free solders.

11. The wafer level package of claim 1, wherein the redistribution layers include a copper solder adhesive layer, and titanium, nickel and palladium barrier layers.

12. The wafer level package of claim 3, wherein each TSV comprises a through-hole penetrating the second semiconductor die, the through-hole being filled with a conductive material.

13. The wafer level package of claim 3, wherein the TSVs are electrically connected to the first semiconductor die.

* * * * *